United States Patent [19]

Katayama et al.

[11] Patent Number: 4,605,945

[45] Date of Patent: Aug. 12, 1986

[54] SEMICONDUCTOR DEVICE

[75] Inventors: Yoshifumi Katayama, Tokorozawa; Yasuhiro Shiraki, Hino; Ken Yamaguchi, Higashikurume; Yoshimasa Murayama, Koganei; Yasushi Sawada; Toshiyuki Usagawa, both of Kokubunji; Eiichi Maruyama, Kodaira, all of Japan

[73] Assignee: Hitachi, Ltd., Tokyo, Japan

[21] Appl. No.: 609,446

[22] Filed: May 11, 1984

[30] Foreign Application Priority Data

May 11, 1983 [JP] Japan .................. 58-80895

[51] Int. Cl.$^4$ ............................. H01L 29/80
[52] U.S. Cl. .................. 357/22; 357/23.2; 357/23.12; 357/16
[58] Field of Search ............... 357/22, 22 MD, 23.2, 357/16, 23.12

[56] References Cited

U.S. PATENT DOCUMENTS 4,424,525 1/1984 Mimura ............... 357/22 MD

FOREIGN PATENT DOCUMENTS 58-143573 8/1983 Japan .

OTHER PUBLICATIONS

Lee et al, *Proceed IEEE/Cornell Conf. High Speed Semiconductor Devices & Circuits*, Aug. 15–17, 1983, Ithica, N.Y.

Hikosaka et al, *JAP Journ. Appl. Phys.*, vol. 20, No. 11, Nov. 1981.

*Primary Examiner*—Martin H. Edlow
*Attorney, Agent, or Firm*—Antonelli, Terry & Wands

[57] ABSTRACT

In a semiconductor device having at least a first semiconductor layer and a second semiconductor layer which are arranged so as to form a heterojunction, an edge of a conduction band of the first semiconductor layer being positioned lower in energy than an edge of a conduction band of the second semiconductor layer in the vicinity of the heterojunction, at least one pair of electrodes which are electronically connected with the first semiconductor layer, and means to control carriers induced in the vicinity of the heterojunction; a semiconductor device characterized in that a low impurity concentration region is comprised in at least the part of the first semiconductor layer between the pair of electrodes, that a region adjoining each of the pair of electrodes is a high impurity concentration region, and that at least one layer containing an impurity which has a conductivity type identical or opposite to that of an impurity contained in the aforementioned regions is comprised in the first semiconductor layer.

22 Claims, 12 Drawing Figures

SEMICONDUCTOR DEVICE

BACKGROUND OF THE INVENTION

1. Field of the Invention

The present invention relates to a field-effect semiconductor device which operates at high speed. More particularly, it relates to a field-effect semiconductor device which controls carriers generated in the vicinity of a semiconductor heterojunction.

2. Description of the Prior Art

For enhancing the performance of a field-effect semiconductor device (hereinbelow, written "FET"), it is effective to first employ a semiconductor material exhibiting a high electron mobility and to secondly shorten a channel length.

In the first place, the employment of a semiconductor material having a high electron mobility will be described.

Gallium arsenide (GaAs) has an electron mobility much higher than that of silicon, and is a material suited for fabricating a high speed device. It has been revealed that, when a gate insulator layer in a MOS (Metal-Oxide-Semiconductor) type field effect transistor is replaced with an aluminum gallium arsenide (AlGaAs) crystal which is doped with a donor impurity, carriers are induced at the interface of the latter, so a field effect transistor can be fabricated. FIG. 1 is a band structure diagram of the active regions of this transistor. Numeral 13 designates an electrode portion, numeral 12 an AlGaAs layer which contains an impurity, and numeral 11 a GaAs layer which contains substantially no impurity. In addition, symbol $F_E$ denotes the Fermi level. In FIG. 1, numeral 15 indicates the carriers which are confined in a two-dimensional potential. The carriers 15 are supplied from a donor impurity level (14) in the AlGaAs (12) and travel within the GaAs containing no impurity, so that they are isolated in place from donor impurity ions. As a result, scattering due to impurity potentials decreases conspicuously, and a high mobility can be realized. However, in the case of fabricating the transistor by the use of electrons of high mobility, the transconductance is lowered by the addition of multiple donors in the AlGaAs, although a gate voltage is effective for the interface region. For preventing this drawback, it is desirable to use AlGaAs doped with no impurity as in the MOS structure. In case of a Schottky type gate, however, gaps often appear between a channel and source and drain electrodes, unlike the case of the MOS structure. In such case, the carriers are not induced in the gap portions when no donor impurity is added in AlGaAs or GaAs. Accordingly, the channel and the source and drain electrodes cannot be connected, and difficulty is involved in the operation of the transistor.

Examples of high-speed field effect transistors thus far described are reported in the following literatures:
(1) T. Mimura et al, Jpn. J. Appl. Phys. 19 (1980) L 225
(2) H. L. Stormer et al, Appl. Phys. Lett. 38 (1981) 691
(3) T. Mimura, Surf. Sci. 113 (1982) 454.

SUMMARY OF THE INVENTION

The present invention consists first in a field effect transistor characterized in that in, e.g., a device having a heterojunction formed between two semiconductor layers of different band gap, a donor impurity is introduced into a gate electrode side semiconductor of wider forbidden band gap, or AlGaAs in the aforementioned example, in the gap region between a channel and a source or drain region, whereas no impurity is introduced into the channel portion directly below a gate electrode. The invention further provides the above structure which can ensure satisfactory characteristics even when the channel is shortened. Such structure brings forth the features (1) that since the AlGaAs in the vicinity of the channel is devoid of any impurity acting as a scattering center, the mobility increases, (2) that since a function equal to that of an insulator layer in a MOS structure can be assigned to the AlGaAs layer, a gate voltage can be effectively applied to the channel portion, and the transconductance can be increased, and (3) that since the gap portions between the channel portions and the source and drain regions are supplied with carriers from the donor impurity, the channel portion can be connected with the source and drain regions, and the operation of the transistor is ensured.

The fundamental construction of the present invention resides in a semiconductor device having at least a first semiconductor layer and a second semiconductor layer which are arranged so as to form a heterojunction, an edge of a conduction band of the first semiconductor layer being positioned lower in energy than an edge of a conduction band of the second semiconductor layer in the vicinity of the heterojunction, at least one pair of electrodes which are electrically connected with the first semiconductor layer, source and drain regions extending through the second semiconductor layer and into the first semiconductor layer, and in electrical connection with the electrodes, and means to control carriers generated in the vicinity of the heterojunction; characterized in that a low impurity concentration region is included in at least the part of said second semiconductor layer between said source and drain regions, that regions adjoining said source and drain regions are high impurity concentration regions, and that at least one region containing an impurity which has a conductivity type identical or opposite to that of an impurity contained in the aforementioned regions is included in said first semiconductor layer.

Preferably, the impurity concentration of the low impurity concentration region between the source and drain regions is not higher than $10^{15}$ cm$^{-3}$ on the average, and the impurity concentration of the high impurity concentration regions adjoining the pair of electrodes is not lower than $10^{16}$ cm$^{-3}$.

Besides, the first semiconductor layer is sometimes formed with a plurality of impurity regions as specified above.

DETAILED DESCRIPTION OF THE INVENTION

In order to facilitate understanding of the present invention, a mere heterojunction field-effect transistor will be first considered.

Figure 1:
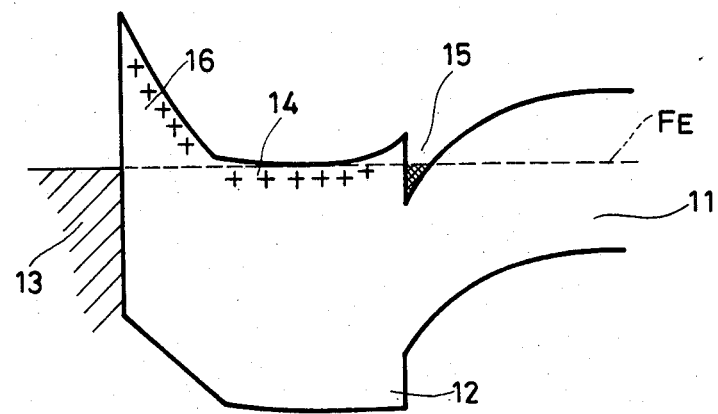
FIG. 1 is an energy diagram of a heterojunction field-effect transistor in a prior art.
Figure 2:
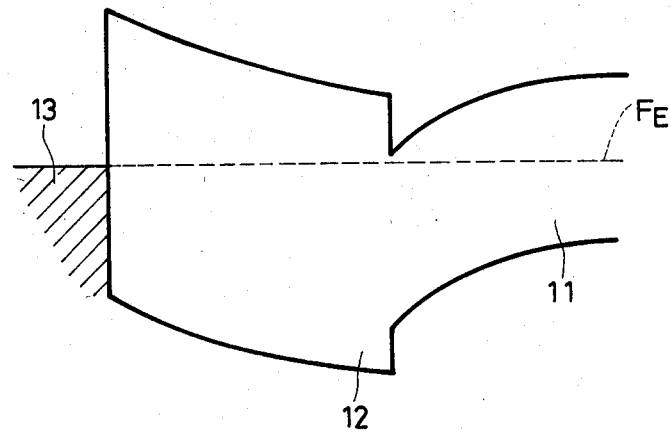
FIG. 2 shows an energy diagram of a transistor according to the present invention.

In case of a hetero-structure field-effect transistor made of AlGaAs and GaAs, the difference of the conduction bands of the GaAs and AlGaAs at the interface is approximately 0.3 eV, and the Schottky barrier is approximately 0.6 eV. Accordingly, when the AlGaAs doped with no impurity is employed, a channel is not formed unless a positive gate voltage is applied. A band structure diagram in this case is shown in FIG. 2. Numeral 13 indicates an electrode portion, numeral 12 an AlGaAs layer, numeral 11 a GaAs layer, and symbol $F_E$ the Fermi level. The case of FIG. 2 corresponds to a normally-off state, and the channel is formed by applying a positive voltage to a gate. That is, the transistor is of the enhancement mode. On the other hand, the case of the prior art using AlGaAs doped with an impurity corresponds to a normally-on state, and the transistor is of the depletion mode. Even in the latter case, however, when the AlGaAs layer is rendered very thin (about 500 Å), a depletion layer (16) based on the Schottky barrier extends to the AlGaAs metal, and the normally-off type is realized. By combining these two types of prior-art transistors, an integrated circuit can be fabricated. The integrated circuit, however, is realized in such manner that the enhancement (normally-off) transistors are fabricated by thinning the AlGaAs layer by etching at the gate portions. It is accordingly laborious to fabricate both types on a single substrate. Another disadvantage of this method is that the characteristics of transistors thus fabricated disperse because of the poor accuracy of the etching process.

With the transistor of the present invention, the above problems are solved in the IC (integrated circuit) implementation. More specifically, in the course of producing a plurality of enhancement-mode transistors of the present invention, only the required transistors may have an impurity introduced thereinto by, e.g., ion implantation, to change a potential profile and to change the threshold value of the gates. If necessary, the impurity concentration may be raised until the normally-on state is reached, so as to form depletion-mode transistors. In this case, in order to prevent the influence of lattice defects formed by the ion implantation and the increase of the scattering probability of carriers attributed to the impurity itself, it is important to perform the ion implantation under the condition that the mean range of ions is at least 300 Å spaced from the hetero-interface. Ion implantation is a technique which is often utilized for the control of threshold values because it can precisely control the quantity of an impurity. Thus, ion implantation is far superior in precision to the etching in the prior art and can lessen the dispersion of characteristics.

Next, there will be described the enhancement of performance attained by shortening the channel length. Contrary to the enhancement of performance, a shortened channel might be attended with an undesirable phenomenon called "punch-through". This will now be explained as to a hetero-structure field effect device (hereinbelow, shortly termed "hetero-structure FET").

Figure 3:
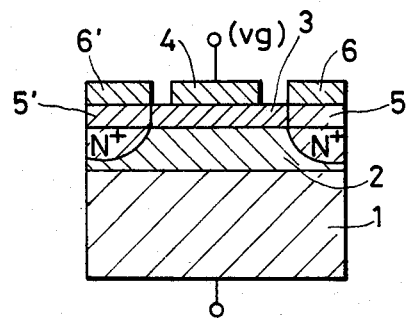
FIGS. 3 and 4 are diagrams for explaining the prior-art heterojunction field-effect transistor.

As shown by way of example in FIG. 3, a prior-art hetero-structure FET has a structure comprising a semi-insulating GaAs substrate 1, an n-type GaAs layer 2 and an n-type $Al_{0.3}Ga_{0.7}As$ layer 3 which are epitaxially grown on the substrate in succession, source and drain regions 5' and 5 which are formed in the layers 2 and 3, and a gate electrode 4 which is disposed on the $Al_{0.3}Ga_{0.7}As$ layer 3.

In the hetero-structure semiconductor device, especially the hetero-structure FET of short channel intended for a high density of integration, a drain current-gate voltage characteristic in a sub-threshold region worsens on account of the source-drain punch-through phenomenon which is caused by an applied drain voltage $V_{DD}$. That is, as compared with the hetero-structure semiconductor device of long channel, the hetero-structure semiconductor device of short channel has the unfavorable property that a punch-through current flows between the source and drain, and the drain current does not pinch off completely.

In contrast, the invention provides a field-effect semiconductor device of short channel having the punch-through suppressed and exhibiting good characteristics, in the following way. In order to reduce the fluctuation of the potential in GaAs layer 2 where the channel is formed, the impurity concentration of the n-type GaAs layer 2 is reduced substantially. Further, in order to suppress the spatial spreading of carriers at high drain voltages which is the cause of punch-through current, a thin layer, in which the impurity of opposite conductivity type to that of the source (or drain) is doped at a high concentration, is formed in the position near the interface between the n-type GaAs layer 2 and the n-type $Al_{0.3}Ga_{0.7}As$ layer 3. Moreover, in order to suppress the spatial spread of the so-called drain depletion region, one or more island-like impurity regions of an impurity opposite in conductivity type to the source (or drain) impurity are formed in positions to which potential lines are liable to spread.

Before mentioning and describing practicable examples, the important points of the present invention will be supplemented.

In the short-channel hetero-structure semiconductor device, the reason why the punch-through current flows is that the drain depletion region extends toward the source side, so the drain depletion region and the source depletion region directly influence each other. Such situation is clarified by FIG. 4. In the illustration, equipotential lines 7 which envelop the drain 5 in a manner to surround it bulge toward the source side, and currents 8 which flow near the interface between a semiconductor body and an insulator film in the ordinary state involving no punch-through come away from the interface and deviate toward the depthwise direction. As the channel length is made shorter, such spatial spread of the current profile becomes more marked, so that a greater punch-through current flows.

Symbol 5' indicates the source, numeral 3 an AlGaAs layer, and numeral 1 a GaAs substrate.

Figure 4:
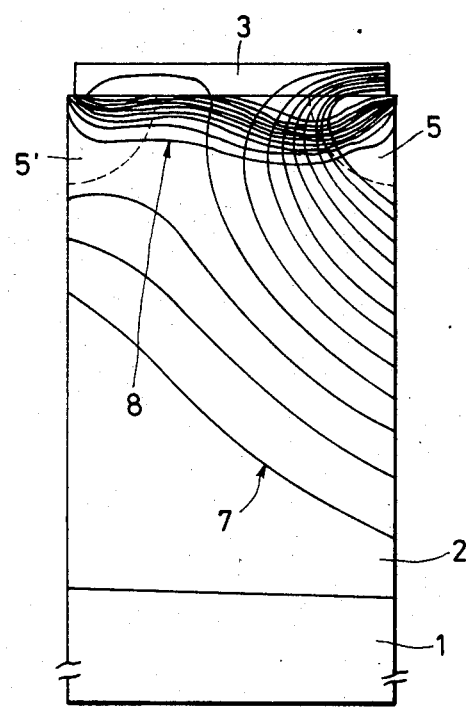

In the present invention, two important concepts are defined to the end of suppressing the punch-through. The first is to suppress the spatial spread of the current profile as shown in FIG. 4 and realize a unidimensional current profile. The second is to restrain the bulges of the equipotential lines from extending toward the source side. That is, the invention achieves the effects of spatially and electrically shielding a drain electric field.

At least one layer, preferably two layers, are required as the special impurity region which is provided in the n-type GaAs layer 2 for the purpose of realizing the two important concepts. The first layer is disposed in a position very close to the interface, while the second layer is disposed in a position of the greatest potential bulge (this layer must be provided). These two layers must be formed of an impurity which is opposite in conductivity type to the source (or drain) impurity. Moreover, in order to realize the two concepts effectively, it is necessary to form the layers with high impurity concentrations and with small thicknesses.

When the two or more layers of the impurity opposite in the conductivity type to the source (or drain) impurity are disposed in this manner, the threshold voltage is prone to become high. The rise of the threshold voltage, however, can be readily controlled by adding a layer of an impurity identical in the conductivity type to the source (or drain) impurity.

The second semiconductor layer having a channel region in the FET of the present invention is set to have impurities with low impurity concentration of at most $10^{15}$ cm$^{-3}$ on the average. In addition, the regions adjacent the source and drain regions are set to have an impurity concentration of at least $10^{16}$ cm$^{-3}$.

Preferably, the aforementioned impurity region to be formed in the first semiconductor layer is such that the product between the thickness and impurity concentration thereof lies between $5 \times 10^{11}$ cm$^{-2}$ and $1 \times 10^{13}$ cm$^{-3}$ inclusive.

The impurity region is preferably provided in a place of a desired depth between 50 and 1000 Å from its interface with the second semiconductor layer. (The first semiconductor layer and second semiconductor layer stated before form a heterojunction, and the forbidden band gap of the first semiconductor layer is set to be smaller than that of the second semiconductor layer. Thus, the edge of the conduction band of the first semiconductor layer is set to lie lower in energy than the edge of the conduction band of the second semiconductor layer. That is, the electron affinity of the first semiconductor layer is greater than that of the second semiconductor layer.) Further, the conductivity type of the impurity region is the p-type or n-type. Besides, the thickness of this impurity layer is 10 Å-500 Å, more preferably 10 Å-200 Å.

The impurity regions to be provided in the first semiconductor layer shall also signify layers stacked by the use of an identical material. Further, as will be seen from embodiments, the impurity regions need not be formed over the whole surface of the substrate, but may be included at least between the source region 5' and the drain region 5 to produce similar effects.

Figure 5:
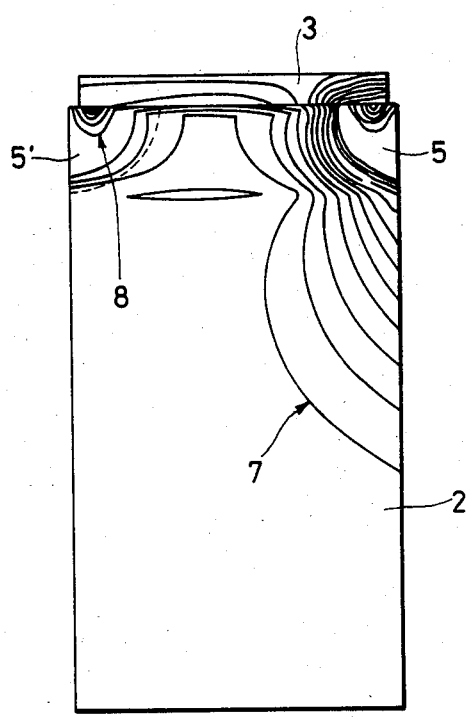
FIG. 5 is a diagram for explaining the operating state of the heterojunction field-effect transistor of the present invention.

Next, an example of the analytical result of the internal operation of a heterojunction semiconductor device according to the present invention is shown in FIG. 5. As apparent from the figure, a current profile 8 is limited to the vicinity of the interface, and also a potential profile (denoted by contour lines) demonstrates a pinning effect on the drain side. Symbols in the figure are the same as those in FIG. 4.

It is needless to say that such shielding effects based on the special impurity regions hold not only in the heterostructure FET, but also in general field effect devices.

Similar effects are produced even when a layer of a semiconductor of great band gap, such as AlGaAs, is inserted instead of the region containing the impurity at the high concentration. The effects are noted at and above approximately 0.03 eV in terms of the difference of band gaps. They are more remarkable at and above approximately 0.05 eV. A layer having a difference of approximately 0.4 eV can also be used.

Embodiments of the field-effect semiconductor device, the principles of which have been described above in detail, will be explained below.

Embodiment 1

Figure 6A:
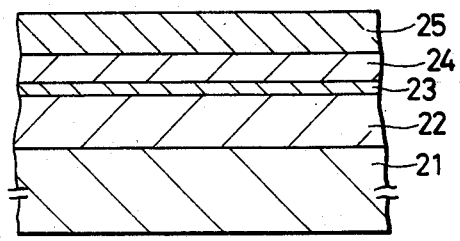
FIGS. 6(a)–6(c) are sectional views showing a manufacturing process for a field effect transistor.
Figure 6B:
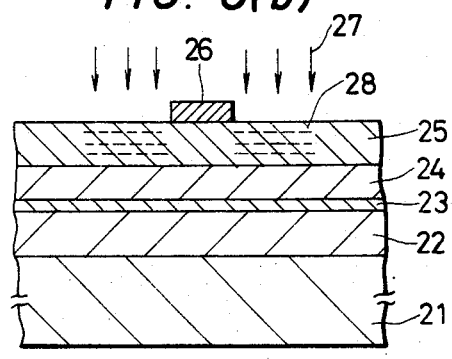
Figure 6C:
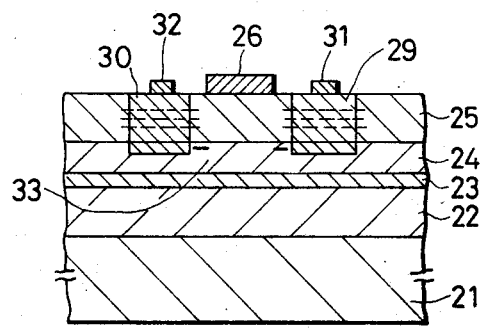

FIGS. 6(a)-6(c) show principal steps.

On a semi-insulating GaAs substrate 21, a GaAs layer (22) which is not intentionally doped with any impurity is grown to a thickness of about 1 μm (usually set at approximately 5000 Å-1.5 μm) at a substrate temperature of 580° C. by employing the well-known molecular beam epitaxy technique. Thereafter, a GaAs layer (23) which contains a p-type dopant in GaAs, such as Zn, at about $2 \times 10^{18}$ cm$^{-3}$ (usually, $1 \times 10^{17} - 1 \times 10^{20}$ cm$^{-3}$) is grown to about 20 Å (usually, 10 Å-500 Å), and a GaAs layer (24) which is not intentionally doped with any impurity is grown to about 300 Å (this value is set at a suitable value between 50 Å and 2000 Å, depending upon the characteristics of a required device), in succession by the use of the molecular beam epitaxy technique. The impurity-containing GaAs layer (23) may well be a multilayer structure which consists of an n-type or p-type layer and a GaAs layer not doped with any impurity. Further, the layer containing the p-type impurity may well be replaced with a layer of a semiconductor greater in the band gap than GaAs, for example, with an Al$_{0.3}$Ga$_{0.7}$As layer doped with no impurity. Besides, in a case where a FET of large current capacity needs to be fabricated, a composite layer of GaAs layer which is not intentionally doped with impurities and which has a thickness of, for example, 500 Å, and a thin GaAs layer which contains n-type impurities at the level of $5 \times 10^{17}$ cm$^{-3}$ with a thickness of 20 Å (usually, 10-500 Å thick) can be replaced by the GaAs layer 23. Further, on the resultant structure, an AlGaAs layer (25) in which the composition ratio between Al and Ga is about 0.3:0.7 is grown to 1200 Å (selected from within a range of approximately 200-500 Å) by the use of the molecular beam epitaxy technique and without adding any impurity intentionally. FIG. 6(a) shows this state.

A metal, for example, Ti; W, to form a gate electrode 26 is deposited on the above epitaxy layer of the multilayer structure to a thickness of about 1 μm, whereupon, using the metal electrode as a mask for ion implantation (self-alignment), Si ions 27 are implanted at a dose of $2 \times 10^{13}$ cm$^{-2}$ by an acceleration voltage of 70 keV. Annealing at 750° C. for 30 minutes is performed in order to remove lattice defects generated by the ion implantation and to activate the ions. Shown at numeral 28 in FIG. 6(b) are the resulting impurity regions. Annealing at a high temperature of 850° C. is more desirable for enhancing the activation rate of the ions. However, in order to prevent the blurring of the interface between AlGaAs and GaAs and to prevent the diffusion of the impurities, the annealing is conducted at the aforementioned temperature.

As the donor impurity, Ge, Sn, Te, Se, S or the like can be employed besides Si. The impurity concentration of approximately $10^{13}-10^{14}$ cm$^{-3}$ to be ion-implanted is set depending upon the extent to which carriers are to be generated, in other words, the required characteristics of the device. The energy of the ion implantation differs depending upon the element to be implanted, and is set in a range of approximately 50-200 keV.

Subsequently, source (29) and drain electrode regions (30) are formed in continuation to the ion-implanted layers by the conventional alloying, and electrode metal Al (31, 32) is formed. Then, a field effect transistor is finished up. Numeral 33 indicates the carriers induced at the interface. FIG. 6(c) shows this state.

The source and drain regions are formed in such a way that, for example, an Au-Ge alloy (2000 Å), Ni (100 Å) and an Au-Ge alloy (3000 Å) are stacked on predetermined parts and are heated at 400° C. in H$_2$ for about 5 minutes.

The transistor thus fabricated has attained the performances of a mobility about 1.5 times and a transconductance about 3 times higher than those of a prior-art heterojunction field effect transistor fabricated by doping AlGaAs with a donor at about $2 \times 10^{18}$ cm$^{-3}$.

Likewise to the prior-art method, it is effective for increasing the transistor fabrication efficiency that GaAs which is chemically stabler than AlGaAs is slightly grown on AlGaAs. The thickness of the growth is approximately 300 Å–2000 Å.

Embodiment 2

An example in which an integrated circuit has been fabricated on a wafer will be described with reference to FIGS. 7(a)–7(d). The fundamental setup in this embodiment is the pair of enhancement-mode and depletion-mode field effect transistors. First, similarly to Embodiment 1, a GaAs layer (22) which is not intentionally doped with any impurity and which is about 1 μm thick is grown on a semi-insulating GaAs substrate 21 at a substrate temperature of 580° C. by molecular beam epitaxy, whereupon a GaAs layer (23) which contains Zn at about $10^{19}$ cm$^{-3}$ and which is about 20 Å thick, and a GaAs layer (24) which is not intentionally doped with any impurity and which is about 500 Å thick are successively grown using molecular beam epitaxy. Further, a GaAlAs layer 25 which is not intentionally doped is grown to about 1200 Å (FIG. 7(a)). Subsequently, in regions to become the transistors, a region to become the depletion-mode transistor is implanted with Si ions (26) at $2 \times 10^{13}$ cm$^{-3}$ by 70 keV (FIG. 7(b)). It is as stated before that, in this case, the ions are more preferably implanted into only the GaAlAs layer 25. Gate electrodes 27 are thereafter formed, whereupon using them as a mask, regions 28 to form the source and drain electrodes of both the transistors are subjected to the second ion implantation under the same conditions as in Embodiment 1, and the impurity is activated by similar annealing. Thus, the enhancement-mode and depletion-mode transistors can be simultaneously fabricated (FIG. 7(c)).

As the donor impurity, Ge, Sn, Te, Se, S or the like can be employed besides Si. The impurity concentration of approximately $10^{13}$–$10^{14}$ cm$^{-3}$ to be ion-implanted is set, depending upon the extent to which carriers are to be induced, in other words, the required characteristics of the device. The energy of the ion implantation differs depending upon the element to be implanted, and is set in a range of approximately 50–200 keV.

Figure 7A:
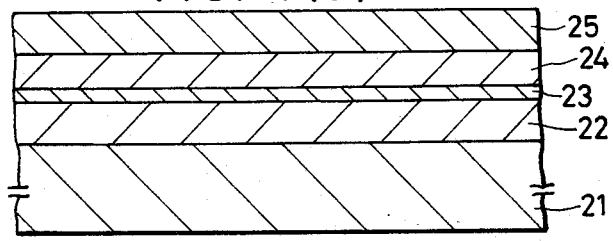
FIGS. 7(a)–7(d) are sectional views showing a manufacturing process in the case of constructing an integrated circuit.
Figure 7B:
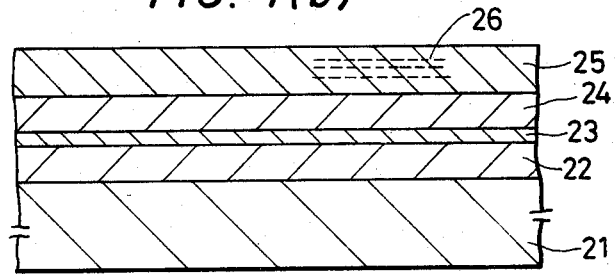
Figure 7C:
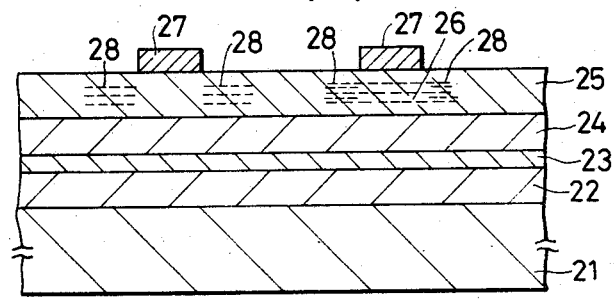
Figure 7D:
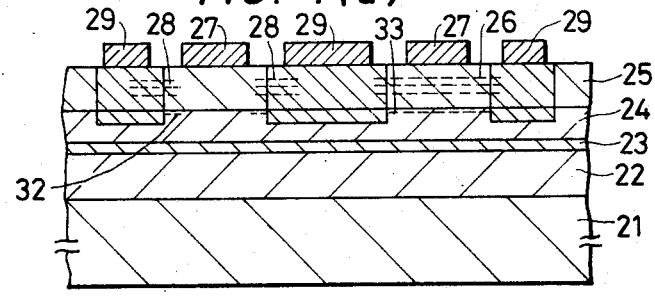

The source and drain regions are formed in such a way that, for example, an Au-Ge alloy (2000 Å), Ni (100 Å) and an Au-Ge alloy (3000 Å) are stacked on predetermined parts and are heated at 400° C. in H$_2$ for about 5 minutes (FIG. 7(d)).

While the above embodiments have been explained on the semiconductor devices constructed of the GaAs-GaAlAs system, other materials adapted to construct heterojunctions are also suitable. They are, for example, Al$_y$Ga$_{1-y}$As-Al$_x$Ga$_{1-x}$As, GaAs-AlGaAsP, InP-InGaAsP, InP-InGaAs, InAs-GaAsSb, and AlInAs-GaInAs.

What is claimed is:

1. A semiconductor device having at least a first semiconductor layer and a second semiconductor layer which are in contact with each other so as to form a heterojunction therebetween, and in which the edge of the conduction band of the first semiconductor layer is lower in energy than the edge of the conduction band of the second semiconductor layer in the vicinity of the heterojunction, said device further comprising at least one pair of electrodes which are electrically connected with the first semiconductor layer, source and drain regions formed in the first and second semiconductor layers and respectively electrically connected to the at least one pair of electrodes, and means to control carriers generated in the vicinity of said heterojunction; wherein said second semiconductor layer includes a low impurity concentration region of a concentration of at most $10^{15}$ cm$^{-3}$ formed between said source and drain regions except regions immediately adjacent the source and drain regions, and high impurity concentration regions immediately adjacent the source and drain regions in the region between the source and drain regions, and wherein the first semiconductor layer includes at least one region containing an impurity which has a conductivity type identical or opposite to that of the impurity contained in the source and drain regions, said at least one region being spaced from said heterojunction.

2. A semiconductor device as defined in claim 1, wherein the impurity concentrations of the high impurity concentration regions immediately adjacent the source and drain regions are at least $10^{16}$ cm$^{-3}$.

3. A semiconductor device as defined in claim 1 or claim 2, wherein a plurality of the regions containing an impurity are formed in said first semiconductor layer.

4. A semiconductor device as defined in claim 1 or 2, wherein a product between an impurity concentration in said impurity region formed in said first semiconductor layer and a thickness of the impurity-doped region is at least $5 \times 10^{11}$ cm$^{-2}$ and at most $1 \times 10^{13}$ cm$^{-2}$.

5. A semiconductor device as defined in claim 1 or 2, wherein a thickness of said impurity region formed in said first semiconductor layer is 10 Å to 500 Å.

6. A semiconductor device as defined in claim 1, wherein said means to control carriers is a gate electrode located on the second semiconductor layer, said gate electrode being located over said low impurity concentration region of said second semiconductor layer.

7. A semiconductor as defined in claim 1, wherein said means to control carriers is located over said low impurity concentration region of said second semiconductor layer.

8. A semiconductor device as defined in claim 1, wherein the at least one region included in the first semiconductor layer contains an impurity of conductivity type opposite to that of the source and drain regions.

9. A semiconductor device as defined in claim 5, wherein the impurity region is formed in the first semiconductor layer at a location spaced 50–1000 Å from the heterojunction.

10. A semiconductor device as defined in claim 1, wherein the impurity region is formed in the first semiconductor layer at a location spaced 50–1000 Å from the heterojunction.

11. A semiconductor device as defined in claim 10, wherein the impurity region formed in the first semiconductor layer has a thickness of 10–200 Å.

12. A semiconductor device as defined in claim 1, further comprising an impurity region formed in said second semiconductor layer, and wherein said means to control carriers is located on the impurity region formed in the second semiconductor layer, and the source and drain regions are located at respective opposing sides of said impurity region.

13. A semiconductor device as defined in claim 12, wherein the impurity concentration of the impurity region formed in the second semiconductor layer is $10^{13}$–$10^{14}$ cm$^{-3}$.

14. A semiconductor device as defined in claim 12, wherein the impurity region formed in the second semiconductor layer is an ion-implanted region.

15. A semiconductor device as defined in claim 12, wherein the impurity used to form the impurity region formed in the second semiconductor layer is selected from the group consisting of Ge, Si, Sn, Te, Se and S.

16. A semiconductor device as defined in claim 1, further comprising:
   an impurity region formed in said second semiconductor layer;
   a further means to control carriers generated in the vicinity of the heterojunction, said further means being located over said impurity region formed in said second semiconductor layer;
   further source and drain regions formed in the first and second semiconductor layers, said further source and drain regions being located at the sides of the impurity region formed in said second semiconductor layer; and
   at least one pair of further electrodes electrically connected to the further source and drain regions, whereby an integrated circuit device is provided.

17. A semiconductor device as defined in claim 16, wherein one electrode of the at least one pair of electrodes and the at least one pair of further electrodes is a common electrode, and one region of the source and drain regions and further source and drain regions is a common region.

18. A semiconductor device as defined in claim 16, wherein the second semiconductor region includes high impurity concentration regions immediately adjacent the further source and drain regions, in the region between the further source and drain regions, and a low impurity concentration region of a concentration of at most $10^{15}$ cm$^{-3}$ between said further source and drain regions with the exception of said high impurity concentration regions.

19. A semiconductor device as defined in claim 1, wherein the first semiconductor layer is a GaAs layer, and the second semiconductor layer is an AlGaAs layer.

20. A semiconductor device having at least a first semiconductor layer and a second semiconductor layer which are in contact with each other so as to form a heterojunction therebetween, and in which the edge of the conduction band of the first semiconductor layer is lower in energy than the edge of the conduction band of the second semiconductor layer in the vicinity of the heterojunction, said device further comprising at least one pair of electrodes which are electrically connected with the first semiconductor layer, source and drain regions formed in the first and second semiconductor layers and respectively electrically connected to the at least one pair of electrodes, and means to control carriers generated in the vicinity of said heterojunction; wherein said second semiconductor layer includes a low impurity concentration region of a concentration of at most $10^{15}$ cm$^{-3}$ formed between said source and drain regions except regions immediately adjacent the source and drain regions, and high impurity concentration regions immediately adjacent the source and drain regions in the region between the source and drain regions, and wherein the first semiconductor layer includes a sublayer of a semiconductor material whose band gap differs from that of the material of the remainder of the first semiconductor layer, said sublayer being spaced from the heterojunction.

21. A semiconductor device as defined in claim 20, wherein the band gap of said sublayer differs by at least 0.03 eV from that of the material of the remainder of the first semiconductor layer.

22. A semiconductor device as defined in claim 20, wherein the band gap of said sublayer differs by 0.05–0.4 eV from that of the material of the remainder of the first semiconductor layer.

* * * * *